United States Patent [19]

Arntsen

[11] 4,173,743
[45] Nov. 6, 1979

[54] COUPLING A FREQUENCY MODULATED SIGNAL TO A TUNED LOAD

[75] Inventor: Arnt P. Arntsen, Manchester, Mass.

[73] Assignee: RCA Corporation, New York, N.Y.

[21] Appl. No.: 882,876

[22] Filed: Mar. 2, 1978

[51] Int. Cl.² .............................................. H03N 7/38
[52] U.S. Cl. .................................... 333/32; 325/132; 325/171
[58] Field of Search ............... 333/17 M, 32; 343/745, 343/860, 861; 325/132, 160, 171

[56] References Cited
PUBLICATIONS

Chang & Locke; Use of the RCA-2N6093 HF Power Transistor in Linear Applications; RCA Application Note AN4591; Mar. 1971.

*Primary Examiner*—Eugene R. LaRoche
*Assistant Examiner*—Robert E. Wise
*Attorney, Agent, or Firm*—H. Christoffersen; Joseph D. Lazar

[57] ABSTRACT

A transmitter provides a frequency modulated voltage and a sawtooth voltage. The sawtooth voltage has an amplitude proportional to the frequency of the modulated voltage. The modulated voltage is coupled to an antenna via a varactor that is biased by the sawtooth voltage.

7 Claims, 4 Drawing Figures

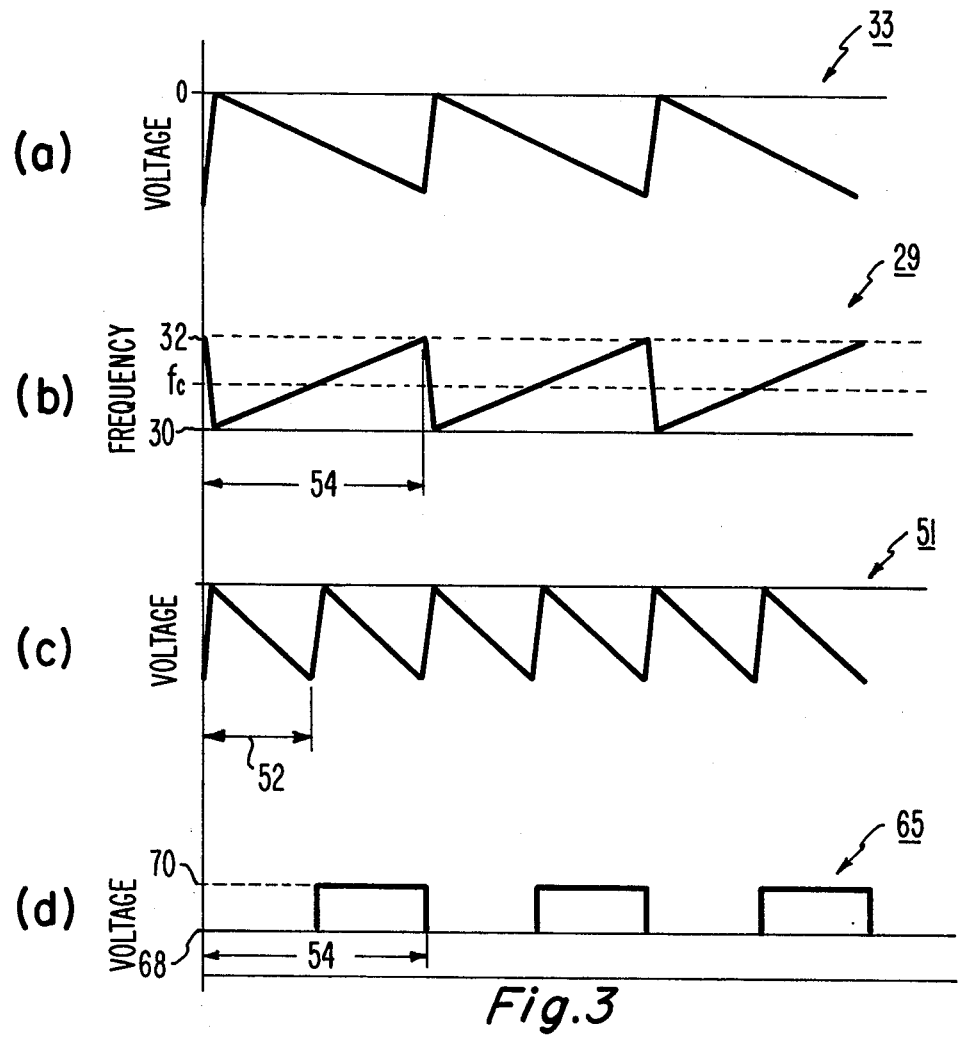
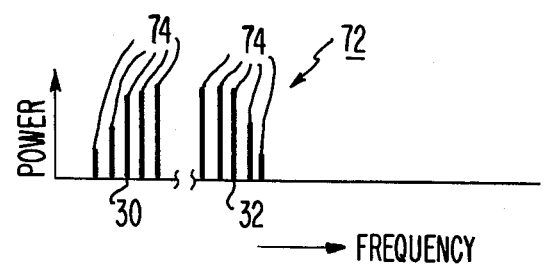

COUPLING A FREQUENCY MODULATED SIGNAL TO A TUNED LOAD

BACKGROUND OF THE INVENTION

1. Field of Invention

This invention is related to variably tuned circuits and more particularly to matching a source of a frequency modulated signal to a load.

2. Description of the Prior Art

In modern warfare, a source of radio frequency radiation, known as a jammer, is used to disrupt either radio communication or radar operation at an enemy installation. The intensity of the radiation at the installation is inversely related to the distance between the installation and the jammer. Therefore, the jammer is most effective when it is located in the vicinity of the installation.

One particular type of jammer is delivered to the vicinity of the installation in a vehicle that is fired from an artillery piece. At a predetermined time after the firing, when the vehicle is at an altitude of several thousand feet, the jammer separates from the vehicle, thereby causing the jammer to rapidly lose altitude. The predetermined time is selected to cause the jammer to land in the vicinity of the installation.

There is a substantial impact between the jammer and the ground when the jammer lands. Because of the distribution of the mass of the jammer, the impact implants the jammer firmly in the ground at a desired attitude with the respect to the ground. The impact causes a whip antenna to emerge from the chassis of the jammer.

The radiation from the jammer is typically frequency modulated over a known band of frequencies. However, the whip antenna is usually substantially resonant over a band of frequencies that is narrow compared to the known band, whereby the antenna mismatches the output impedance of the jammer to the impedance of free space at frequencies within the known band. The mismatch causes the radiation to be at a reduced level, thereby decreasing the effectiveness of the jammer.

SUMMARY OF THE INVENTION

According to the present invention, a frequency modulated signal, which has a frequency within a known band, is coupled from a source to a load via a tuned circuit. The circuit is tuned to the frequency in response to a signal that has an amplitude proportional to the frequency.

In one specific embodiment, a source of a frequency modulated signal is connected to an antenna through a varactor, whereby the modulated signal is provided to the antenna. The varactor matches the antenna to the source in response to a signal that has an amplitude proportional to the frequency of the modulated signal.

BRIEF DESCRIPTION OF THE DRAWING

FIG. 3 are waveforms, all on the same time base, of signals provided by apparatus of the first and second embodiments;

FIG. 4 is a graphic showing of the power density spectrum of radiation by an antenna in the embodiment of FIG. 1.

DESCRIPTION OF THE PREFERRED EMBODIMENT

The present invention is predicated upon automatically tuning a circuit to a frequency of a signal provided by a signal source.

Figure 1:
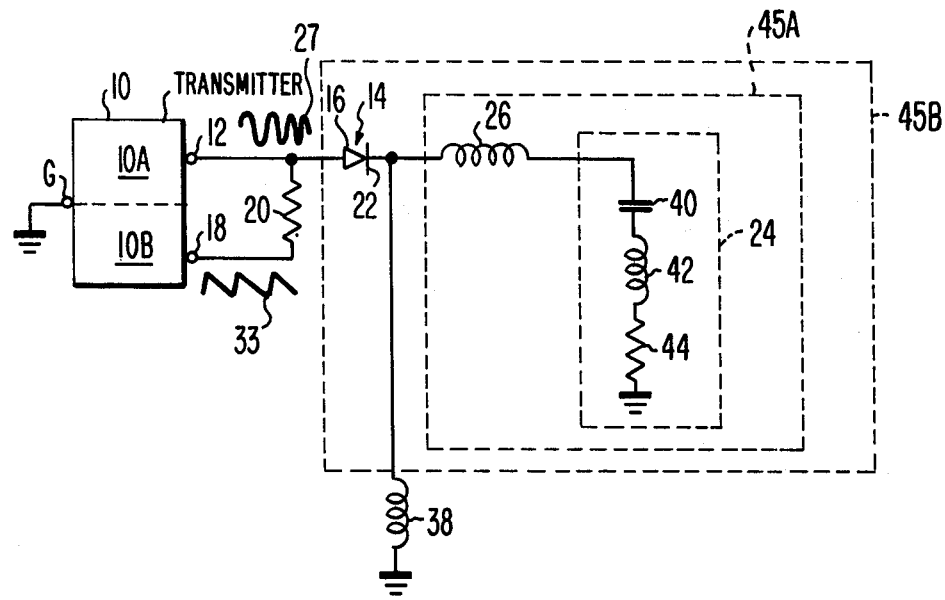
FIG. 1 is a schematic block diagram of a first embodiment of the present invention.

As shown in FIG. 1, in a first embodiment of the present invention, a portion 10A of a transmitter 10 of a jammer has an output terminal 12 connected to a varactor 14 at the anode 16 thereof. Additionally, a portion 10B of transmitter 10 has an output terminal 18 connected to anode 16 through a resistor 20. The cathode 22 of varactor 14 is connected to a one quarter wave whip antenna 24 through an inductor 26. Accordingly, varactor 14, inductor 26, and antenna 24 are all connected in series.

A frequency modulated voltage 27 is provided at terminal 12. As explained hereinafter, a voltage provided at terminal 18 biases varactor 14 to cause varactor 14, inductor 26 and antenna 24 to match the impedance of portion 10A to the impedance of free space.

As shown in FIG. 3 (b), voltage 27 (FIG. 1) has frequencies 29 that vary from a first frequency 30, to a second frequency 32. Additionally, any of frequencies 29 are proportional to the amplitude of a negative sawtooth voltage 33 (FIG. 3 (a)) provided at terminal 18 (FIG. 1). Voltage 33 has a frequency much less than frequencies 29 as defined by a modulation index explained hereinafter.

Frequencies 29 are in accordance with a frequency relationship which is given as:

$$f_i = f_c + (\Delta f_D)(f(t)) \quad (1)$$

where $f_i$ is one of frequencies 29;

$f_c$ is a center frequency, which is one half of frequencies 30 and 32;

$\Delta f_D$ is a frequency deviation, which is one half of the difference between frequencies 30 and 32;

f(t) is the amplitude of the negative sawtooth voltage 33 as a function of time.

The frequency deviation, $\Delta f_D$, of the frequency relationship (1) and the frequency of negative sawtooth voltage 33 define a modulation index which is given as:

$$\beta = \Delta f_D / f_m \quad (2)$$

where $\beta$ is the modulation index; and $f_m$ is the frequency of the negative sawtooth voltage 33.

Preferably, the modulation index ($\beta$) is a number greater than 10.

Modulated voltage 27 is coupled to antenna 24 (FIG. 1) through varactor 14 and inductor 26, thereby causing the jammer to radiate. It should be understood that the voltages provided at terminals 12 and 18 are with respect to a ground terminal, G, of transmitter 10.

Varactor 14 is a diode that has a capacitance directly related to the amplitude of an applied reverse bias voltage. Varactors are well known in the electronics art.

In this embodiment, the reverse bias is negative sawtooth voltage 33. As explained hereinafter, the application of negative sawtooth voltage 33 causes portion 10A to be matched to free space.

To apply negative sawtooth voltage 33 to varactor 14, cathode 22 is additionally connected to ground through an inductor 38. Inductor 38 has a very high impedance at frequencies 29, whereby inductor 38 has substantially no effect on the coupling of the modulated voltage 27 to antenna 24. However, inductor 38 has a very low impedance compared to the impedance of the varactor 14 at fundamental and low harmonic frequencies associated with negative sawtooth voltage 33. Similarly, resistor 20 has a resistance which is low compared to the impedance of varactor 14 at the fundamental and low harmonic frequencies associated with the negative sawtooth voltage 33. Accordingly, resistor 20 and inductor 38 provide a path for the application of negative sawtooth voltage 33.

Antenna 24 is schematically represented as a capacitor 40, inductor 42, and a resistor 44, connected in series to ground. Moreover, antenna 24 is tuned to the center frequency ($f_c$). However, inductor 26 and antenna 24 form a series circuit 45A that is tuned to a frequency which is less than first frequency 30 (FIG. 3 (b)).

Varactor 14, inductor 26, and antenna 24 form a series circuit 45B that is tuned in response to negative sawtooth voltage 33. Moreover, because negative sawtooth voltage 33 is applied to varactor 14, circuit 45B resonates at frequencies 29 of the modulated voltage 27. Accordingly, circuit 45B matches portion 10A of transmitter 10 to free space.

For one particular construction, the first (30) and second (32) frequencies are 20 MHz and 30 MHz, respectively, the center frequency ($f_c$) is 25 MHz and the frequency deviation ($\Delta f_D$) is 5 MHz. Additionally, the frequency of negative sawtooth voltage 33 is 10 MHz, whereby the modulation index ($\beta$) equals 500. Moreover, varactor 14 provides a capacitance that varies from 76 picofarads to 9.6 picofarads when antenna 24 and inductor 26 have values which are given as:

Capacitor 40=16.8 picofarads;
Inductor 42=2.4 microhenries;
Resistor 44=38 ohms; and
Inductor 26=1.8 microhenries.

For the values given hereinbefore, circuit 45A is tuned to a frequency of about 18 MHz. Additionally, in response to negative sawtooth voltage 33, varactor 14 causes circuit 45B to be tuned to frequencies 29 of modulated voltage 27.

As known to those skilled in the art, the use of varactor 14 to tune circuit 45B is limited by stray capacitance. Accordingly, in a second embodiment of the present invention, the effect of such stray capacitance is reduced by a switching arrangement that applies a short circuit across inductor 26 when frequencies 29 exceed the center frequency ($f_c$).

Figure 2:
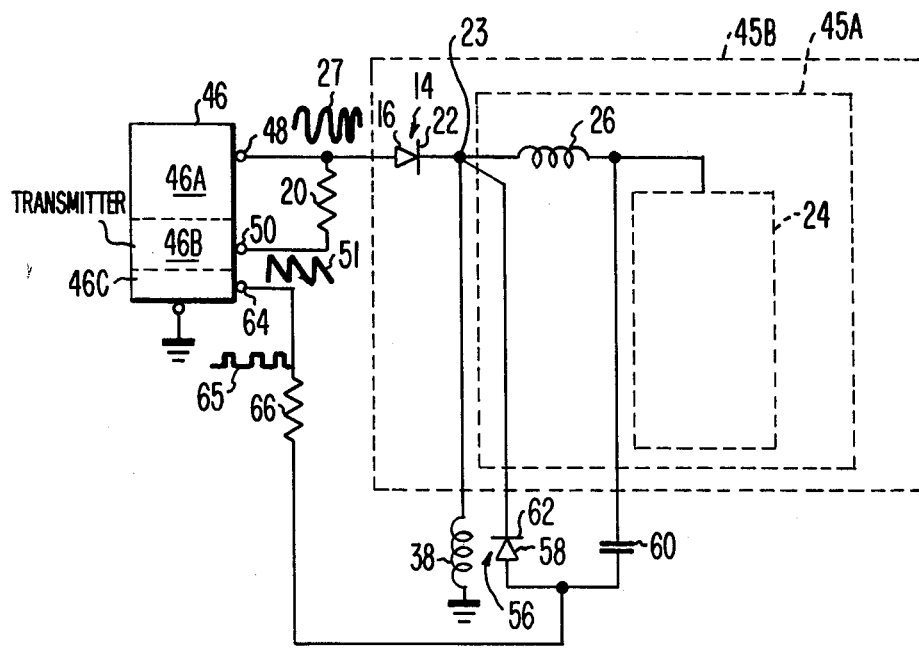
FIG. 2 is a schematic block diagram of a second embodiment of the present invention.

As shown in FIG. 2, transmitter 46 of a jammer has a portion 46A with an output terminal 48 connected to anode 16. Additionally, transmitter 46 has a portion 46B with an output terminal 50 connected to anode 16 through resistor 20. Varactor 14, inductor 26 and antenna 24 are all connected in series as described in connection with the first embodiment.

Frequency modulated voltage 27 is provided at terminal 48. However, unlike the first embodiment, portion 46B provides (at terminal 50) a short period sawtooth voltage 51 that has a sawtooth period 52 (FIG. 3 (c)) which is one half of a modulation period 54 (FIG. 3b) of the frequency modulated voltage 27. Short period sawtooth voltage 51 biases varactor 14 in a manner similar to the biasing of varactor 14 in the first embodiment.

The switching arrangement referred to hereinbefore is comprised of a PIN diode 56 that has its anode 58 connected to antenna 24 and inductor 26 through a capacitor 60. As known to those skilled in the art, when a PIN diode is biased to conduct a forward current, it provides substantially a short circuit at radio frequencies. Conversely, the PIN diode is substantially an open circuit when no forward current flows therethrough. Capacitor 60 provides a very low impedance at frequencies 29 of modulated voltage 27 compared with the impedance of inductor 26.

The cathode 62 of diode 56 is connected to the junction 23 of cathode 22 and inductors 26 and 38, whereby inductor 38 provides a path to ground for a forward current that passes through diode 56. Therefore, when the forward current flows through diode 56, diode 56 and capacitor 60 substantially provide a short circuit across inductor 26.

Anode 58 is additionally connected to terminal 64 of portion 46C of transmitter 46 through resistor 66. Portion 46C provides (at terminal 64) a switching voltage 65 (FIG. 3 (d)) having a period 54. During one half of period 54, switching voltage 65 is at a low level 68 that does not cause the forward current to flow through diode 56, whereby diode 56 and capacitor 60 substantially provide an open circuit across inductor 26. During the other half of period 54, switching voltage 65 is at a high level 70 that causes the forward current to flow through diode 56, whereby diode 56 and capacitor 60 substantially provide a short circuit across inductor 26.

During a time that either of levels 68 or 70 is provided, short period sawtooth voltage 51 causes varactor 14 to provide a known range of capacitance. When diode 62 and capacitor 60 provide the open circuit, the known range of capacitance causes circuit 45B to be tuned to frequencies 29 that range from frequency 30 to the center frequency ($f_c$). When diode 62 and capacitor 60 provide the short circuit, the known range of capacitance causes circuit 45B to be tuned to frequencies 29 that range from the center frequency ($f_c$) to frequency 32. From the explanation given hereinbefore, the capacitance of varactor 14 and the periodic short circuiting of inductor 26 are both utilized to cause the resonant frequency of circuit 45B to correspond to the frequencies 29 of the modulated voltage 27.

In a still further alternative embodiment, a varactor is included in an interstage coupling network of the transmitter of a jammer. The output of one stage of the transmitter corresponds to a source and the input of another stage of the transmitter corresponds to a tuned load. The coupling network couples the output of the one stage to the input of the other stage.

In still another alternative embodiment, first and second varactors are used to couple first and second halves, respectively, of a center feed antenna to a transmitter of a jammer. The coupling of each half is similar to the coupling of antenna 24 in the first and second embodiments.

Although the first and second embodiments (FIGS. 1 and 2) includes a variable reactance (varactor 14) in series with antenna 24, an alternative embodiment may include the variable reactance in parallel with an antenna. Another alternative embodiment may include variable reactive elements that are in a series-parallel combination with an antenna.

As shown in FIG. 4, a signal radiated by antenna 24 has a power density spectrum 72 which is normally represented by a multiplicity of evenly spaced frequencies 74. When, for example, the frequencies 30 and 32 are 20 MHz and 30 MHz, respectively, and the modulation index is 500, the frequencies have a spacing of 10 kilohertz.

The spacing between the frequencies 74 is an undesirable aspect of the power spectrum density 72. Typically, a random noise voltage additionally modulates the modulated voltage to eliminate the spacing. The noise voltage and the sawtooth voltage are additively provided at terminal 18 (FIG. 1) and terminal 50 (FIG. 2).

What is claimed is:

1. A circuit for matching a tuned load to a source that provides a frequency modulated signal, comprising:
   means for providing a bias signal having an amplitude that is substantially proportional to the frequency of said modulated signal; and
   means responsive to said bias signal for tuning said circuit to the frequency of said modulated signal.

2. The circuit of claim 1 wherein the frequency of said modulated signal has a known period and the amplitude of said bias signal has a sawtooth waveform with said known period.

3. The circuit of claim 1 wherein the frequency of said modulated signal has a known period and the amplitude of said bias signal has a sawtooth waveform with a period that is a portion of said known period, additionally comprising:
   a reactive circuit element coupled to said load;
   means for providing a switching signal with a rectangular waveform having said known period; and
   switching means for changing the reactance provided by said reactive element for a preselected part of said known period in response to said switching signal.

4. The circuit of claim 3 wherein said reactive circuit element is an inductor.

5. The circuit of claim 3 wherein said inductor is connected in series with said load.

6. The circuit of claim 4 wherein said switching means provides a substantially short circuit across said reactive element for one half of said known period.

7. The circuit of claim 1 wherein said responsive means comprises a varactor.

* * * * *